(12) United States Patent
Ghosh

(10) Patent No.: US 8,944,873 B2
(45) Date of Patent: Feb. 3, 2015

(54) METHOD OF MANUFACTURING ORGANIC LIGHT EMITTING DIODE ARRAYS AND SYSTEM FOR ELIMINATING DEFECTS IN ORGANIC LIGHT EMITTING DIODE ARRAYS

(75) Inventor: Amalkumar P. Ghosh, Beacon, NY (US)

(73) Assignee: eMagin Corporation, Hopewell Junction, NY (US)

( * ) Notice: Subject to any disclaimer, the term of this patent is extended or adjusted under 35 U.S.C. 154(b) by 0 days.

(21) Appl. No.: 13/484,677

(22) Filed: May 31, 2012

(65) Prior Publication Data

US 2012/0244774 A1 Sep. 27, 2012

Related U.S. Application Data

(62) Division of application No. 12/897,837, filed on Oct. 5, 2010.

(60) Provisional application No. 61/278,437, filed on Oct. 7, 2009.

(51) Int. Cl.
*H01J 9/50* (2006.01)
*H01L 51/00* (2006.01)
*H01L 51/56* (2006.01)

(52) U.S. Cl.
CPC .............. *H01J 9/50* (2013.01); *H01L 51/0031* (2013.01); *H01L 51/56* (2013.01); *H01L 2251/568* (2013.01)
USPC ................................................ 445/2; 445/61

(58) Field of Classification Search
USPC .......................... 445/61–63, 2; 313/498–512
See application file for complete search history.

(56) References Cited

U.S. PATENT DOCUMENTS

| 6,332,016 | B1 | 12/2001 | Kobayashi |
| 7,292,024 | B2 | 11/2007 | Zhang |
| 7,688,446 | B2 | 3/2010 | Nabatova-Gabain |
| 2006/0061248 | A1 | 3/2006 | Cok |
| 2006/0164407 | A1 | 7/2006 | Cok |
| 2008/0085652 | A1 | 4/2008 | Winters |
| 2009/0061720 | A1* | 3/2009 | Fujimaki ........................... 445/2 |
| 2010/0233931 | A1* | 9/2010 | Yamagata et al. .............. 445/61 |

* cited by examiner

*Primary Examiner* — Anne Hines
(74) *Attorney, Agent, or Firm* — Epstein Drangel LLP; Robert L. Epstein

(57) ABSTRACT

A method for manufacturing an organic light emitting diode (OLED) array is provided that includes applying an energizing signal to at least one of the OLED pixels in the array. The energizing signal exceeds a threshold level. The method also includes reducing the energizing signal and identifying an OLED in the array that continues to remain energized. The method further includes irradiating the identified OLED to degrade the organic material in the OLED. A method of performing quality control in a manufacturing process of an OLED array is provided. The method includes determining an intensity, a time and a wavelength of radiation sufficient to render an OLED of the OLED array inoperative by degrading organic material in the OLED. A system of performing quality control in a manufacturing process of an OLED array is provided. A computer-readable medium having stored thereon computer-executable instructions is provided.

7 Claims, 4 Drawing Sheets

METHOD OF MANUFACTURING ORGANIC LIGHT EMITTING DIODE ARRAYS AND SYSTEM FOR ELIMINATING DEFECTS IN ORGANIC LIGHT EMITTING DIODE ARRAYS

CROSS-REFERENCE TO RELATED APPLICATIONS

This application is a divisional application of U.S. patent application Ser. No. 12/897,837, filed Oct. 5, 2010, which claims the benefit of U.S. Provisional Application No. 61/278,437, filed Oct. 7, 2009, which are incorporated herein by reference.

STATEMENT REGARDING FEDERALLY SPONSORED RESEARCH OR DEVELOPMENT

Not Applicable

BACKGROUND OF THE INVENTION

1. Field of the Invention

The present invention relates to organic light emitting diode ("OLED") devices. In particular, the present invention relates to a method and system for manufacturing OLED devices that degrades individual defective OLED pixels in the OLED device.

2. Description of Prior Art

An OLED device typically includes a stack of thin layers formed on a substrate. In the stack, a light-emitting layer of a luminescent organic solid, as well as adjacent semiconductor layers, is sandwiched between a cathode and an anode. The light-emitting layer may be selected from any of a multitude of fluorescent organic solids. Any of the layers, and particularly the light-emitting layer, may consist of multiple sub layers.

In a typical OLED, either the cathode or the anode is transparent. The films may be formed by evaporation, spin casting, other appropriate polymer film-forming techniques, or chemical self-assembly. Thicknesses typically range from a few monolayers to about 1 to 2,000 angstroms. Protection of OLED against oxygen and moisture can be achieved by encapsulation of the device. The encapsulation can be obtained by means of a single thin-film layer situated on the substrate, surrounding the OLED.

High resolution active matrix displays may include millions of pixels and sub-pixels that are individually addressed by the drive electronics. Each sub-pixel can have several semiconductor transistors and other IC components. Each OLED may correspond to a pixel or a sub-pixel, and these terms are used interchangeably herein.

OLED pixels have a threshold energizing signal at which point they turn on, and begin to emit light. As the energizing signal falls below the threshold level, a correctly operating OLED ceases to emit light. During the manufacture of an OLED device including an array of OLED pixels, disturbances or contamination may cause one or more OLED pixels to not operate properly. Due to processing issues or contamination, a few sub-pixels can remain on irrespective of the driving conditions. In particular, some OLED pixels may continue to emit light after the energizing signal has fallen below the threshold level. These defective sub-pixels, also called inoperative OLED pixels, may also be called stuck-on pixels or stuck-on OLED pixels.

In many applications the stuck-on sub-pixels are very undesirable, which may result in a zero tolerance for stuck-on sub-pixels. Out of millions of sub-pixels in a display it is typically very difficult to obtain a display with zero stuck-on pixels or sub-pixels. One or more stuck-on OLED pixels may compromise an entire array of OLED pixels, and conventionally may require that the entire array to be discarded.

BRIEF SUMMARY OF THE INVENTION

A method to selectively identify stuck-on sub-pixels and eliminate them is provided. The method may be particularly suited to performance early in the production process for an OLED array to thereby reduce or eliminate unnecessary processing costs, by for instance identifying OLED arrays that may not be able to be repaired.

A method for manufacturing an organic light emitting diode (OLED) array including OLED pixels is provided that includes at least partially forming the OLED array. Each OLED pixel in the OLED array includes organic material and is responsive to an energizing signal exceeding a threshold level to energize the particular OLED pixel. The method includes applying the energizing signal to the OLED pixels in the array. The energizing signal exceeds the threshold level. The method also includes reducing the energizing signal applied to the OLED pixels below the threshold level, and identifying a stuck-on OLED pixel in the array that continues to remain energized after the signal is reduced below the threshold level. The method further includes irradiating the stuck-on OLED pixel to degrade the organic material in the stuck-on OLED pixel.

A method of performing quality control in a manufacturing process of an organic light emitting diode (OLED) array including OLED pixels is provided. The method includes determining intensity, a time and a wavelength of radiation sufficient to render an OLED pixel of the OLED array inoperative by degrading organic material in the OLED pixel. The determining operation is based on at least one of a first degradability of the organic material, a first absorption spectrum of the organic material, a second degradability of at least one surface layer of the OLED array, and a second absorption spectrum of the at least one surface layer of the OLED array. The method also includes identifying a stuck-on OLED pixel of the OLED array, and exposing the stuck-on OLED pixel to the radiation at the determined intensity, the determined time and the determined wavelength.

A system of performing quality control in a manufacturing process of an organic light emitting diode (OLED) array including OLED pixels is provided. The system includes means for applying an energizing signal to the OLED pixels in which the energizing signal exceeds a threshold level. The method further includes means for reducing the energizing signal applied to the OLED pixels below the threshold level, and means for identifying a stuck-on OLED pixel of the array of OLED pixels. Furthermore, the system includes means for irradiating the stuck-on OLED pixel to degrade the organic material in the stuck-on OLED pixel.

A computer-readable medium having stored thereon computer-executable instructions is provided. The computer-executable instructions cause a processor to perform a method when executed in which the method performs quality control in a manufacturing process of an organic light emitting diode (OLED) array including OLED pixels.

DETAILED DESCRIPTION OF THE INVENTION

Figure 1:
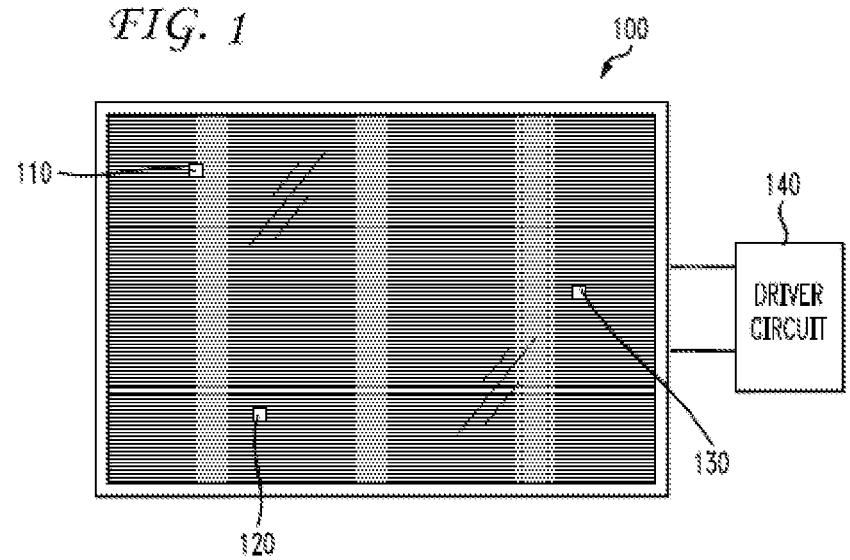
FIG. 1 is a plan view of an OLED array and a testing device during a testing procedure in accordance with an exemplary embodiment.

The method involves locating a defective sub-pixel by turning on the entire display near threshold of emission. The defective sub-pixel (or pixel, referred to hereinafter as a stuck-on OLED pixel) is destroyed by exposure to radiation that degrades the organic material in the stuck-on OLED pixel, rather than by ablation, which may destroy any sealing layers that have been created. Performance of the method early in the production process, and in particular prior to the application of one or more sealing, filtering or other layers, may reduce the limitations on the features (e.g., wavelength, intensity, duration) of the light used to degrade the organic materials in the defective OLED pixel, and/or may increase the effectiveness of the organic material degradation by reducing or eliminating interference with the radiation prior to the radiation contacting the defective OLED pixel. Alternatively, the method may be performed at the end of the manufacturing process.

A defect elimination system according to an exemplary embodiment allows the whole display to be dark, while only the defective stuck-on pixel(s) will be brightly lit up. This situation is achieved by energizing the OLED array above a threshold level and then reducing the energizing signal below the threshold level. Once the pixel or sub-pixel is detected and located with the help of a high power microscope it will be brought into the center of the field of view with the help of cross-wires. Light of suitable wavelength and intensity is used to precisely irradiate the defective sub-pixel so that the organic materials in the OLED device are photo-chemically degraded. This in turn leads to reduced or no light emission from the irradiated sub-pixel. This method of eliminating a stuck-on pixel may be unique to the OLED device since the organic materials are sensitive to short wavelength light and degrade rapidly under intense illumination. After elimination of defective OLED pixels using the present method and/or system, when the OLED display is later lit up, dark regions exist where a short wavelength light was illuminated for a certain period of time. The exposure time can be reduced by increasing the dose of illumination.

The exposing operation may include taking care to avoid directing the ultraviolet or visible light at OLED pixels situated adjacent to the OLED. The ultraviolet or visible light may be directed at the OLED by focusing or other methods, and adjacent OLED pixels may be shielded from the ultraviolet or visible light by shielding. Additionally or alternatively, adjacent OLED pixels may have different characteristics, for instance when adjacent OLED pixels emit different color light, and may be composed of different organic materials. In these situations, the radiation used to degrade the organic materials in the defective OLED may be selected to reduce the effect of any exposure to the radiation experienced by the different organic material in the adjacent OLED pixels.

One factor to be taken into consideration is that the illuminating light needs to go through a series of dielectric layers—both organic and inorganic. As such, the wavelengths of the illuminating light is important and should be chosen so that it does not damage the layers of materials though which it passes to the reach the stuck-on pixel. Based on the absorption spectrum of one of the key materials (emission layer) in the OLED device, visible light may be used having a wavelength of 405 nm, 488 nm (which may be particularly well suited to green and blue color filters), and/or 551 nm (or 555 nm, either of which may be particularly well suited to a red color filter). These wavelengths are particularly interesting because they are in the visible region and do not cause any damage to the other layers in the OLED device. Another wavelength of the illuminating light may be effective ultraviolet light having a wavelength of 365 nm Although these are specific wavelengths mentioned here, there could be a range of wavelengths that could be equally efficient in degrading the desired pixel. The choice of the illuminating wavelength also depends on the layers of dielectric material that the light needs to pass through before impinging on the defective sub-pixel. Furthermore, as discussed above, the wavelength, intensity and duration of the radiation selected to degrade the organic material may be selected to reduce or eliminate the impact of any errant radiation received by adjacent pixels, especially in the situation in which the adjacent pixels include different organic materials and/or different sensitivities with respect to radiation exposure.

The method may include, subsequent to the irradiation of the OLED, testing the array of OLED pixels to determine if the identified OLED has been rendered inoperative. The testing of the array of OLED pixels to determine if a stuck-on OLED has been rendered inoperative may include repeating the operation of applying the energizing signal to the OLED pixels, repeating the operation of reducing the energizing signal applied to the at least one of the OLED pixels below the threshold level, and determining if the stuck-on OLED of the array of OLED pixels is emitting light. If the stuck-on OLED is emitting light, the method may include performing the operations of further irradiating the OLED to further degrade the organic material in the OLED, and further testing the array of OLED pixels to determine if the identified OLED has been rendered inoperative.

In a further irradiating operation according to an exemplary method, at least one of a first intensity, a first time and a first wavelength of a first radiation used in the irradiating operation is changed to at least one of a second intensity, a second time and a second wavelength of a second radiation.

Some exemplary methods include determining intensity, a time and a wavelength of radiation sufficient to render an OLED of the OLED array inoperative by degrading organic material in the OLED. The organic material in an OLED may include organo-metallic chelates (for example, Alq3), conjugated dendrimers, poly(p-phenylene vinylene) and polyfluorene, or their derivatives, or any other appropriate organic material. Degradation by irradiation of these or other organic materials involve a photo-chemical reaction changing the chemical composition of the OLED. The determining operation is based on at least one of a first degradability of the organic material, a first absorption spectrum of the organic material, a second degradability of at least one surface layer of the OLED array, and a second absorption spectrum of the at least one surface layer of the OLED array.

FIG. 1 is a plan view of a partially formed OLED array 100 connected to driver circuit 140 for purposes of testing and eliminating stuck-on OLED pixels. During testing, driver circuit 140 is connected to the anode and cathode circuits of OLED array 100 in order to drive each OLED above an energizing threshold, at which time the OLED becomes illuminated. The energizing signal may be applied to all of the OLED pixels, or fewer than all of the OLED pixels in partially formed OLED array 100. Subsequently, driver circuit 140 is operated to reduce the voltage on the anode and cathodes to below the threshold voltage level. The reducing of the energizing signal below the threshold level may include maintaining the energizing signal at a percentage of the threshold level in which the percentage is less than 100%. The percentage may exceed 90%, may exceed 75%, or may exceed 50%.

The threshold level as discussed herein is also referred to as a D.C. voltage, above which an OLED pixel emits light responsive to an additional A.C. voltage. The variability of the additional A.C. voltage provides a variable intensity output for the OLED pixel. The OLED pixel may have 256 intensity levels within the additional A.C. voltage, with 1 being the lowest intensity and 256 being a maximum intensity. In this case the D.C. voltage corresponds to a black output characterized as a zero level. The threshold level discussed above would in this case correspond to level 1, below which the OLED pixel output should be black.

FIG. 1 illustrates OLED array 100 being driven by driver circuit 140 at a level below the threshold voltage level after being driven above the threshold voltage level. FIG. 1 illustrates that OLED array 100 includes three stuck-on OLED pixels, or pixels, namely, stuck-on OLED pixels 110, 120 and 130. Each of stuck-on OLED pixels 110, 120 and 130 continues to be illuminated even though driver circuit 140 drives OLED array 100 at a level below the threshold voltage level. Driver circuit 140 may be operated at a level below the threshold voltage level but 1) above 90% of the threshold voltage level, 2) above 75% of the threshold voltage level, 3) above 50% of the threshold voltage level, or 4) above any appropriate percentage of the threshold voltage level.

Alternatively, driver circuit 140 may operate as a current source to thereby energize the OLED pixels, and to subsequently reduce the current to below a threshold energizing level.

Figure 2:
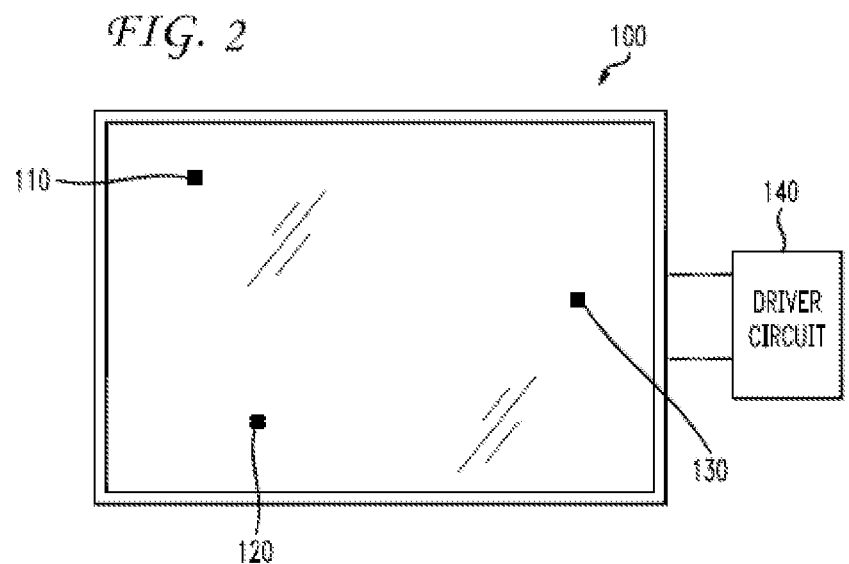
FIG. 2 is a plan view of the OLED array and the testing device of FIG. 1 after performance of a method in accordance with an exemplary embodiment.

FIG. 2 is a plan view of OLED array 100 after performance of an operation to eliminate stuck-on OLED pixels. Irradiating stuck-on OLED pixels 110, 120 and 130 with radiation sufficient to degrade the organic material therein causes the OLED pixels to become inoperative. Therefore, application of a voltage or current above a threshold level by driver circuit 140 causes all of the OLED pixels in OLED array 100 to illuminate, except stuck-on OLED pixels 110, 120 and 130. Therefore, each of stuck-on OLED pixels 110, 120 and 130 remains dark in FIG. 2, while the remainder of OLED array 100 is illuminated. Though this may reduce the overall brightness of OLED array 100, driver circuit 140, or any other driver circuit connected to OLED array 100 during testing or operation, may be configured to compensate for the loss of brightness due to the elimination of stuck-on OLED pixels 110, 120 and 130.

Figure 3:
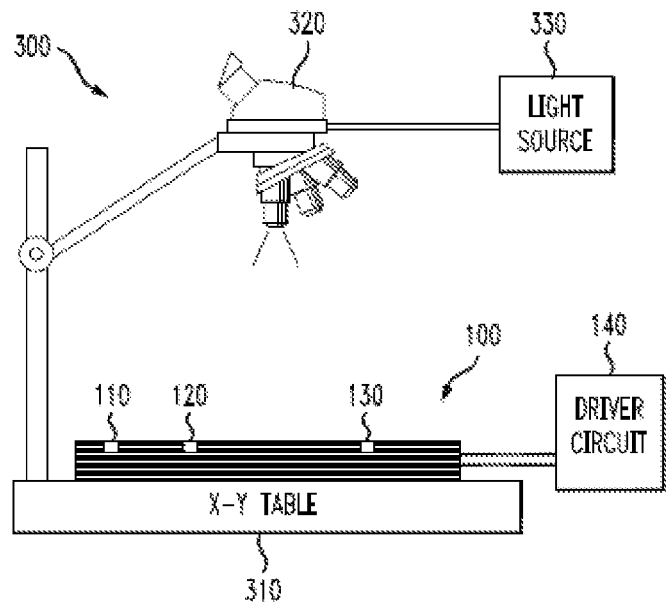
FIG. 3 is a side view of the OLED array and the testing device of FIG. 1, with an examination system in accordance with an exemplary embodiment.

FIG. 3 is a side view of OLED array 100 and driver circuit 140. OLED array 100 is situated on x-y table 310, which may be operated to move OLED array 100 laterally and longitudinally. Additionally, x-y table 310 may be operated to move OLED array 100 vertically. Microscope 320 is positioned above OLED array 100 and may be connected to light source 330. Microscope 320 may be connected to light source 330 by a fiber optic cable, or by any other appropriate method. Alternatively, light source 330 may be independent of microscope 320 but fixedly situated adjacent or near to it. Microscope 320 may be any appropriate sensor for detecting an illuminated OLED pixel, including an array of light sensors. Microscope 320 and light source 330 may also be arranged to move laterally and longitudinally, and possibly also vertically, in addition to or instead of the movement provided by x-y table 310. Microscope 320 may be connected to a processor and adapted to identify the location of stuck-on OLED pixels 110, 120 and 130. Alternatively or additionally, x-y table 310 may also provide location information to a processor to identify stuck-on OLED pixels 110, 120 and 130.

Figure 4:
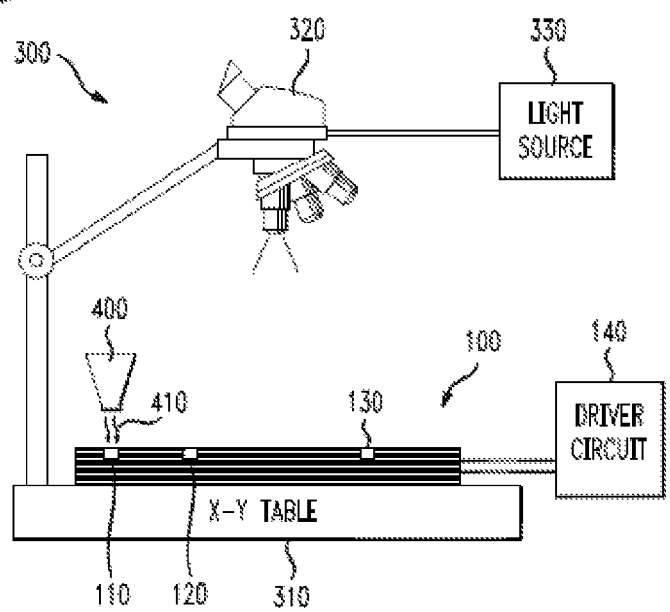
FIG. 4 is a side view of the OLED array, the testing device and the examination system of FIG. 3, with a defect elimination system in accordance with an exemplary embodiment.

FIG. 4 is a side view of OLED array 100, driver circuit 140, x-y table 310, microscope 320, and light source 330. Also shown in FIG. 4 is defect elimination system 400, which may be a radiation source, adapted to project radiation 410 in a narrow beam onto the surface of OLED array 100. Defect elimination system 400 may be arranged to move laterally and longitudinally, and possibly also vertically, in addition to or instead of the movement provided by x-y table 310. Defect elimination system 400 may be adapted to project radiation 410 in a beam sufficiently narrow to reduce or eliminate any degradation of OLED pixels situated adjacent to stuck-on OLED pixels 110, 120 and 130. Radiation 410 may be variable with respect to frequency, time and intensity in order to effectively degrade the organic materials in the stuck-on OLED pixels 110, 120 and 130.

Figure 5:
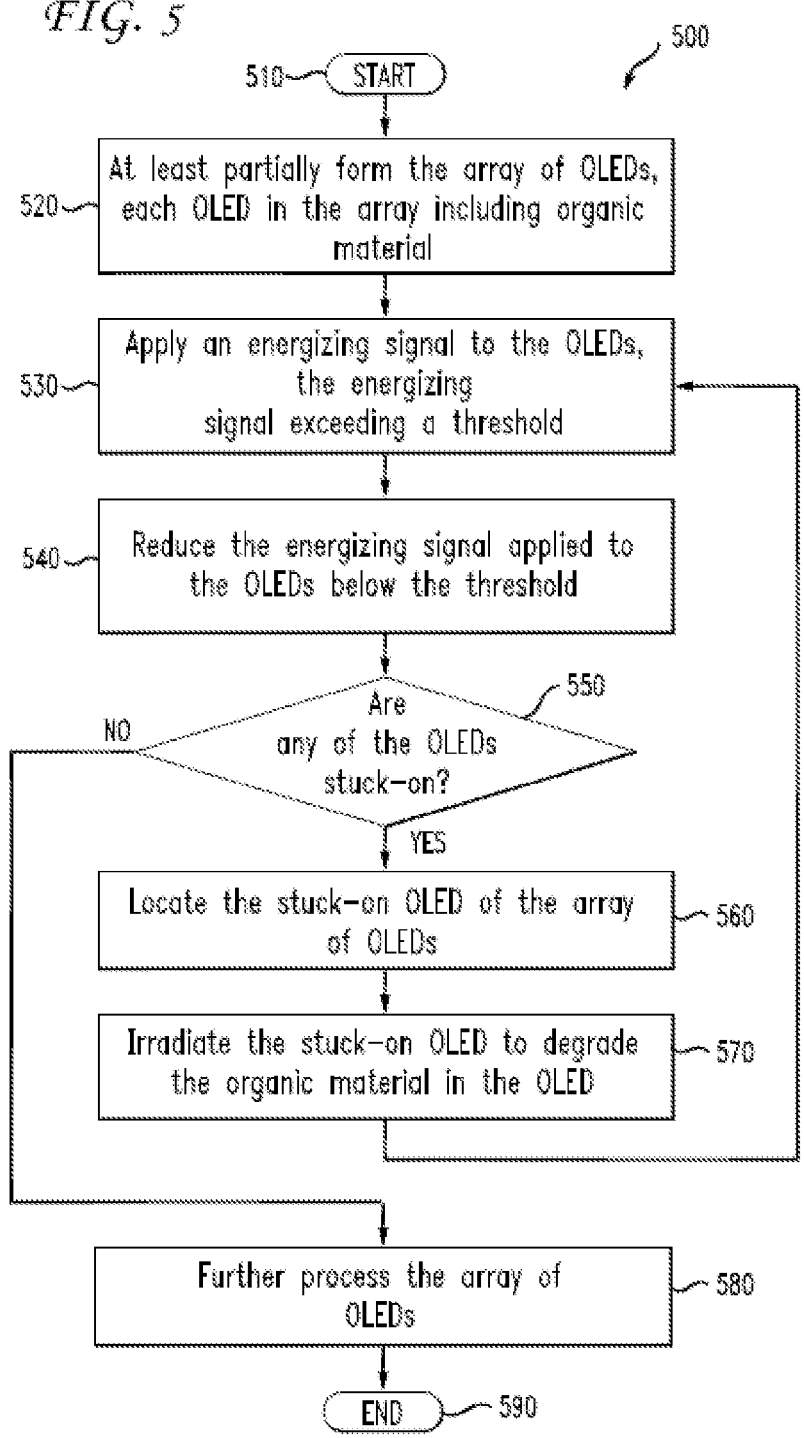
FIG. 5 illustrates a method according to an exemplary embodiment.

FIG. 5 illustrates method 500 according to an exemplary embodiment. Method 500 starts at start circle 510 and proceeds to operation 520, which indicates to at least partially form the array of OLED pixels. Each OLED in the array formed includes organic material. From operation 520 the flow in method 500 proceeds to operation 530, which indicates to apply an energizing signal to the OLED pixels. The energizing signal exceeds a threshold level. From operation 530 the flow in method 500 proceeds to operation 540, which indicates to reduce the energizing signal to the OLED pixels below the threshold level. From operation 540 the flow in method 500 proceeds to decision 550, which asks whether any of the OLED pixels are stuck-on. If the answer to decision 550 is affirmative, the flow proceeds to operation 560, which indicates to locate the stuck-on OLED in the OLED array. Operation 560 may include determining if an OLED is emitting light, determining a location of the OLED that is emitting light, and, if the OLED is emitting light, the OLED is identified as the identified OLED by the location. From operation 560 the flow in method 500 proceeds to operation 570, which indicates to irradiate the stuck-on OLED to degrade the organic material in the OLED. From operation 570 the flow in method 500 proceeds back to operation 530, which operates at this point the beginning of a test of the effectiveness of the defect elimination operation. If the answer to decision 550 is negative, the flow proceeds to operation 580, which indicates to further process the array of OLED pixels. Further processing may include adding protective layers or sealing layers to the OLED array. The sealing layers for the OLED array may be organic or inorganic. Additionally or alternatively, color filters may be added during this further processing, after the elimination of stuck-on OLED pixels. From operation 580, the flow proceeds to end circle 590.

Figure 6:
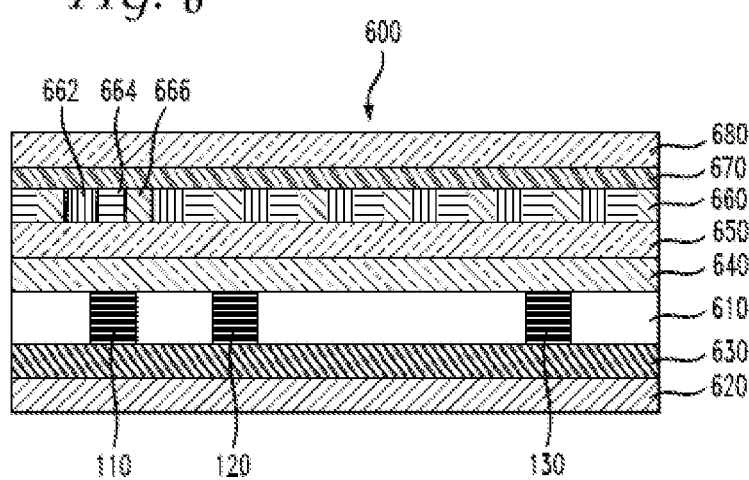
FIG. 6 is a side view of an OLED array including internal layers and sealing layers in accordance with an exemplary embodiment.

FIG. 6 is a side view of a complete OLED array 600 including OLED layer 610 and various other layers in accordance with an exemplary embodiment. OLED array 100 discussed above in regard to the FIGS. 1-4 may include some or all of the layers of complete OLED array 600. OLED layer 610 includes stuck-on OLED pixels 110, 120 and 130. Layer 620 is arranged on the bottom of complete OLED array 600, and may include $Al_2O_3$, which may seal the OLED, reflect light output from the OLED layer 610 and/or operate as a cathode or anode for OLED layer 610. Layer 620 may be arranged on another layer which provides a substrate, drive circuitry and/or any other appropriate function. Layer 630 arranged above layer 620 and directly below OLED layer 610 may include parylene, which may provide the function of sealing OLED layer 610. Layer 640 arranged above OLED layer 610 may include parylene, which may be deposited in a thin film by vapor deposition, and may provide the function of sealing OLED layer 610. Layer 640 may be UV sensitive, and in particular may be sensitive to UV light of less than 365 nm wavelength. Therefore, layer 640 may be deposited after the elimination of defective OLED pixels using the method, or the wavelength of light used to eliminate the OLED pixels may be determined in consideration of the effect on this layer, and in particular may be selected to be equal to greater than 365 nm wavelength. Layer 650 arranged above layer 640 may include $SiO_2$, which may be deposited by any appropriate method. Layer 650 may provide a transparent cathode or anode for controlling OLED layer 610.

Layer 660 arranged above layer 650 may be a color filter, which may include filter sections 662, 664 and 666. Filter sections 662, 664 and 666 are shown in only a small section of layer 650, but may fill the entire width of layer 660. Filter sections 662, 664 and 666 may correspond to red, blue and green filters, in no particular order other than forming a regular pattern within layer 660. Each filter section may correspond to a particular OLED, so that energizing the particular OLED causes light to be filtered through the particular filter section. Layer 660 may be deposited by any appropriate method. Alternatively, layer 660 may not be included in the layers of complete OLED array 600 if the OLED array is used to only emit a single color of light, or if different OLED pixels that emit different colors of light are included in OLED layer 610.

Layer 670 arranged above layer 660 may include glue or another adhesive for attaching a glass or other final sealing material. Layer 670 may be deposited by any appropriate method. Layer 680 arranged above layer 670 may include glass, which may be attached mechanically to the glue of layer 670 while the glue is tacky. Layer 680 may provide the function of sealing the OLED array in order to prevent contamination of the OLED pixels in OLED layer 610, as well as preventing the degradation of any other components.

The method for manufacturing an organic light emitting diode (OLED) array may include, subsequent to the irradiation of the OLED, applying a surface layer to the array of OLED pixels. Any of the layers shown in FIG. 6 that are not present at the time of the identification and irradiation steps for eliminating stuck-on OLED pixels may be applied after that process to form complete OLED array 600. The layers in complete OLED array 600 may be deposited or arranged in any appropriate manner, including vacuum deposition, thermal evaporation, printing, and/or spin coating.

Figure 7:
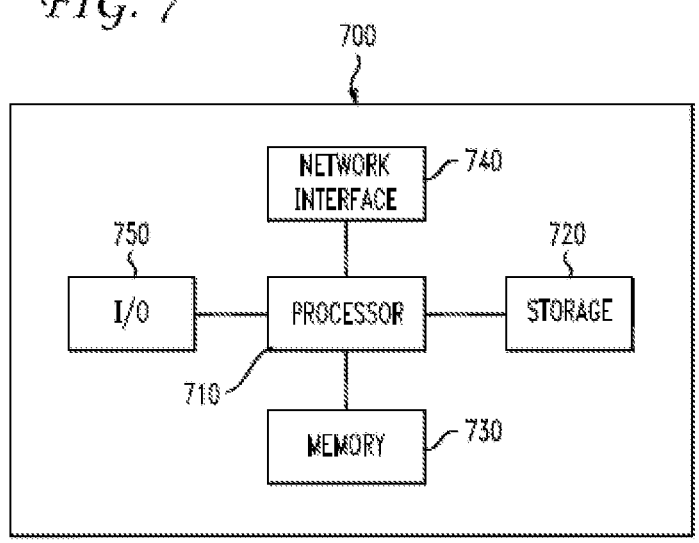
FIG. 7 illustrates a computer system according to an exemplary embodiment.

FIG. 7 illustrates a computer system according to an exemplary embodiment. Computer 700 can, for example, operate driver circuit 140, x-y table 310, microscope 320, light source 330, or defect elimination system 400. Additionally, computer 700 can perform the steps described above (e.g., with respect to FIG. 5). Computer 700 contains processor 710 which controls the operation of computer 700 by executing computer program instructions which define such operation, and which may be stored on a computer-readable recording medium. The computer program instructions may be stored in storage 720 (e.g., a magnetic disk, a database) and loaded into memory 730 when execution of the computer program instructions is desired. Thus, the computer operation will be defined by computer program instructions stored in memory 730 and/or storage 720 and computer 700 will be controlled by processor 710 executing the computer program instructions. Computer 700 also includes one or more network interfaces 740 for communicating with other devices, for example other computers, servers, or websites. Network interface 740 may, for example, be a local network, a wireless network, an intranet, or the Internet. Computer 700 also includes input/output 750, which represents devices which allow for user interaction with the computer 700 (e.g., display, keyboard, mouse, speakers, buttons, webcams, etc.). One skilled in the art will recognize that an implementation of an actual computer will contain other components as well, and that FIG. 7 is a high level representation of some of the components of such a computer for illustrative purposes.

While only a limited number of preferred embodiments of the present invention have been disclosed for purposes of illustration, it is obvious that many modifications and variations could be made thereto. It is intended to cover all of those modifications and variations which fall within the scope of the present invention, as defined by the following claims.

I claim:

1. A method of performing quality control in a manufacturing process of an organic light emitting diode (OLED) array comprising OLED pixels, comprising:
   determining an intensity, a time and a wavelength of radiation sufficient to render an OLED pixel of the OLED array inoperative by degrading organic material in the OLED pixel, the determining operation being based on at least one of a first degradability of the organic material, a first absorption spectrum of the organic material, a second degradability of at least one surface layer of the OLED array, and a second absorption spectrum of the at least one surface layer of the OLED array;
   identifying a stuck-on OLED pixel of the OLED array; and
   rendering the stuck-on OLED inoperative by degrading the organic material in the active portion of the stuck-on OLED pixel through irradiation of the stuck-on OLED,
   wherein the irradiation includes directing one of ultraviolet and visible light at the stuck-on OLED pixel and wherein the one of ultraviolet and visible light is visible light having a wavelength of about one of the following: 365 nm, 405 nm, 488 nm and 555 nm.

2. The method of claim 1 wherein the irradiation includes avoiding directing the one of ultraviolet and visible light at adjacent OLED pixels situated adjacent to the stuck-on OLED pixel.

3. A method of performing quality control in a manufacturing process of an organic light emitting diode (OLED) array comprising OLED pixels, comprising:
   determining an intensity, a time and a wavelength of radiation sufficient to render an OLED pixel of the OLED array inoperative by degrading organic material in the OLED pixel, the determining operation being based on at least one of a first degradability of the organic material, a first absorption spectrum of the organic material, a second degradability of at least one surface layer of the OLED array, and a second absorption spectrum of the at least one surface layer of the OLED array;
   identifying a stuck-on OLED pixel of the OLED array; and
   exposing the stuck-on OLED pixel to the radiation at the determined intensity, the determined time and the determined wavelength;
wherein the one of ultraviolet and visible light is visible light having a wavelength of about 555 nm.

4. A method of performing quality control in a manufacturing process of an organic light emitting diode (OLED) array comprising OLED pixels, comprising:

determining an intensity, a time and a wavelength of radiation sufficient to render an OLED pixel of the OLED array inoperative by degrading organic material in the OLED pixel, the determining operation being based on at least one of a first degradability of the organic material, a first absorption spectrum of the organic material, a second degradability of at least one surface layer of the OLED array, and a second absorption spectrum of the at least one surface layer of the OLED array;

identifying a stuck-on OLED pixel of the OLED array; and exposing the stuck-on OLED pixel to the radiation at the determined intensity, the determined time and the determined wavelength;

wherein the one of ultraviolet and visible light is ultraviolet light having a wavelength of about 488 nm.

5. A method of performing quality control in a manufacturing process of an organic light emitting diode (OLED) array comprising OLED pixels, comprising:

determining an intensity, a time and a wavelength of radiation sufficient to render an OLED pixel of the OLED array inoperative by degrading organic material in the OLED pixel, the determining operation being based on at least one of a first degradability of the organic material, a first absorption spectrum of the organic material, a second degradability of at least one surface layer of the OLED array, and a second absorption spectrum of the at least one surface layer of the OLED array;

identifying a stuck-on OLED pixel of the OLED array; and exposing the stuck-on OLED pixel to the radiation at the determined intensity, the determined time and the determined wavelength;

wherein the one of ultraviolet and visible light is visible light having a wavelength of about 405 nm.

6. A method of performing quality control in a manufacturing process of an organic light emitting diode (OLED) array comprising OLED pixels, comprising:

determining an intensity, a time and a wavelength of radiation sufficient to render an OLED pixel of the OLED array inoperative by degrading organic material in the OLED pixel, the determining operation being based on at least one of a first degradability of the organic material, a first absorption spectrum of the organic material, a second degradability of at least one surface layer of the OLED array, and a second absorption spectrum of the at least one surface layer of the OLED array;

identifying a stuck-on OLED pixel of the OLED array; and exposing the stuck-on OLED pixel to the radiation at the determined intensity, the determined time and the determined wavelength;

wherein the one of ultraviolet and visible light is ultraviolet light having a wavelength of about 365 nm.

7. A method of anon-transitory computer-readable medium having stored thereon computer-executable instructions, to cause a processor to perform quality control in a manufacturing process of an organic light emitting diode (OLED) array comprising OLED pixels, when executed, the method comprising:

determining an intensity, a time and a wavelength of radiation sufficient to render an OLED pixel of the OLED array inoperative by degrading organic material in the OLED pixel, the determining operation being based on at least one of a first degradability of the organic material, a first absorption spectrum of the organic material, a second degradability of at least one surface layer of the OLED array, and a second absorption spectrum of the at least one surface layer of the OLED array;

identifying a stuck-on OLED pixel of the OLED array; and rendering the stuck-on OLED inoperative by degrading the organic material in the active portion of the stuck-on OLED pixel through irradiation of the stuck-on OLED, wherein the irradiation includes direction one of ultraviolet and visible light at the stuck-on OLED pixel and wherein the one of ultraviolet and visible light is visible light having a wavelength of about one of the following: 365 nm, 405 nm, 488 nm and 555 nm.

\* \* \* \* \*